United States Patent [19]

Long et al.

[11] Patent Number: 4,908,942
[45] Date of Patent: Mar. 20, 1990

[54] METHOD OF MAKING AN ELECTRICAL TERMINAL

[75] Inventors: William B. Long, Camp Hill; Barry M. Shenk, Elizabethtown, both of Pa.

[73] Assignee: AMP Incorporated, Harrisburg, Pa.

[21] Appl. No.: 701,819

[22] Filed: Feb. 19, 1985

Related U.S. Application Data

[60] Continuation of Ser. No. 575,487, Jan. 31, 1984, abandoned, which is a continuation of Ser. No. 475,811, Mar. 16, 1983, abandoned, which is a division of Ser. No. 232,478, Feb. 9, 1981, abandoned.

[51] Int. Cl.$^4$ .............................................. H01R 13/41
[52] U.S. Cl. ........................................ 29/882; 439/82; 439/751
[58] Field of Search ............ 339/17 C, 221 R, 221 M, 339/252 P; 29/882; 439/82, 751, 825–827, 873, 888

[56] References Cited

U.S. PATENT DOCUMENTS

| | | | |
|---|---|---|---|
| 3,047,832 | 7/1962 | Deakin | 339/217 |
| 3,309,761 | 3/1967 | Deakin | 29/155.55 |
| 3,420,087 | 1/1969 | Hatfield et al. | 72/338 |
| 3,545,080 | 12/1970 | Evans | 29/629 |
| 3,663,930 | 5/1972 | Henschen et al. | 339/252 P |
| 3,743,979 | 7/1973 | Schor | 339/252 P |
| 3,783,433 | 1/1974 | Kurtz et al. | 339/17 C |
| 3,955,877 | 5/1976 | Cobaugh et al. | 339/258 P |
| 4,017,143 | 4/1977 | Knowles . | |
| 4,066,326 | 1/1978 | Lovendusky | 339/221 M |
| 4,119,360 | 10/1978 | Linkowski | 339/221 M |
| 4,166,667 | 9/1979 | Griffin . | |
| 4,186,982 | 2/1980 | Cobaugh et al. | 339/17 C |
| 4,191,440 | 3/1980 | Schramm . | |
| 4,206,964 | 6/1980 | Olsson | 339/221 M |

Primary Examiner—Gary F. Paumen
Attorney, Agent, or Firm—Frederick W. Raring; Adrian J. LaRue; Anton P. Ness

[57] ABSTRACT

An electrical terminal device has stamped and formed post portions of U-shaped cross-section which are stiff and suitable for wire wrapping and has a compliant mounting portion between the post portions for mounting the terminal in a plated through-hole in a circuit board. The compliant mounting portion comprises outwardly bowed portions extending longitudinally between aligned associated sidewalls of the U-shaped post portions which are elastically deformable inwardly and towards each other. When one of the terminal post is inserted into the circuit board hole, these bowed portions are flexed towards each other when they enter the circuit board hole and the edges of the bowed portions bear against the surface of the hole thereby to establish contact with the plating in the hole and retain the terminal in the circuit board. The U-shaped post portions, but not the compliant mounting portion, are severely cold-worked.

3 Claims, 3 Drawing Sheets

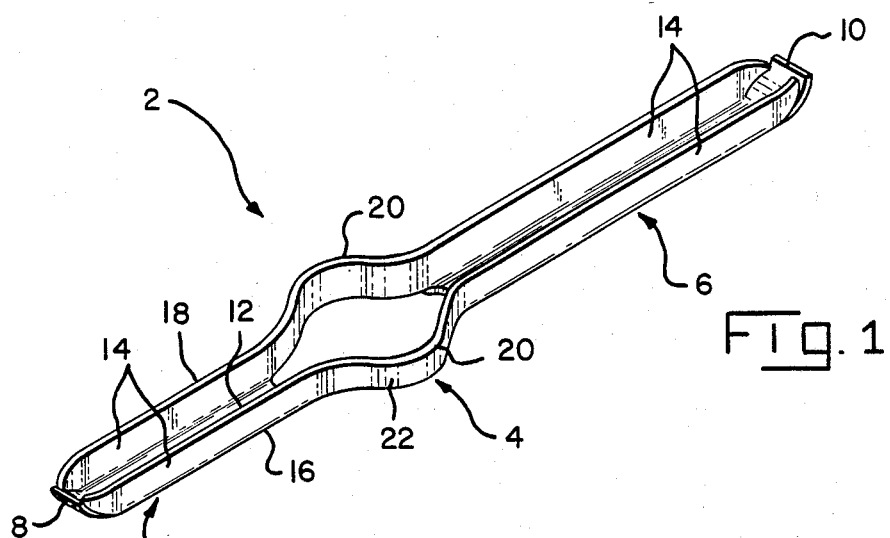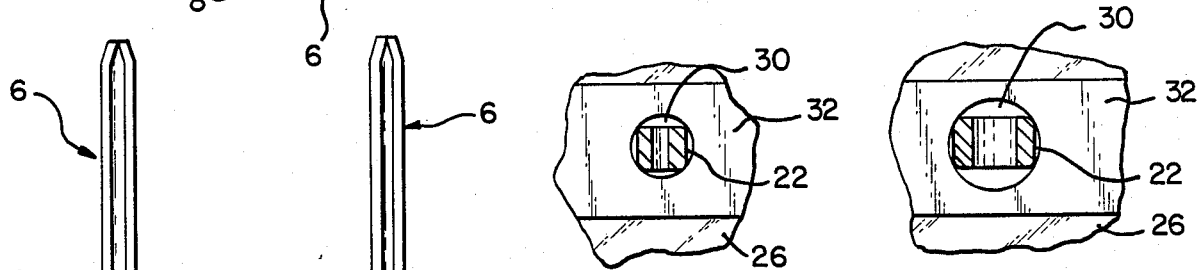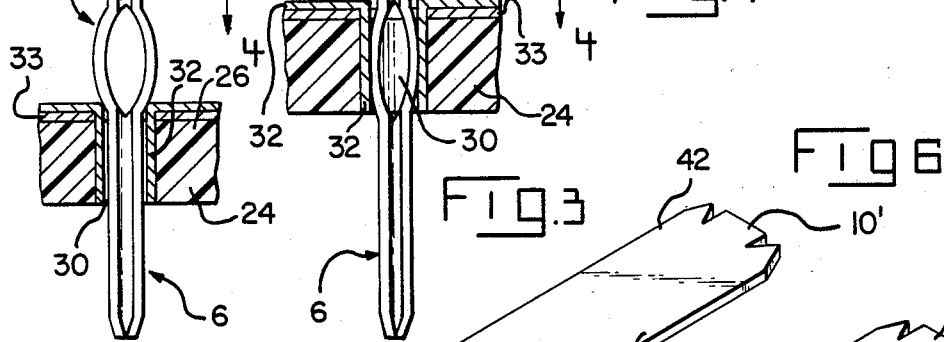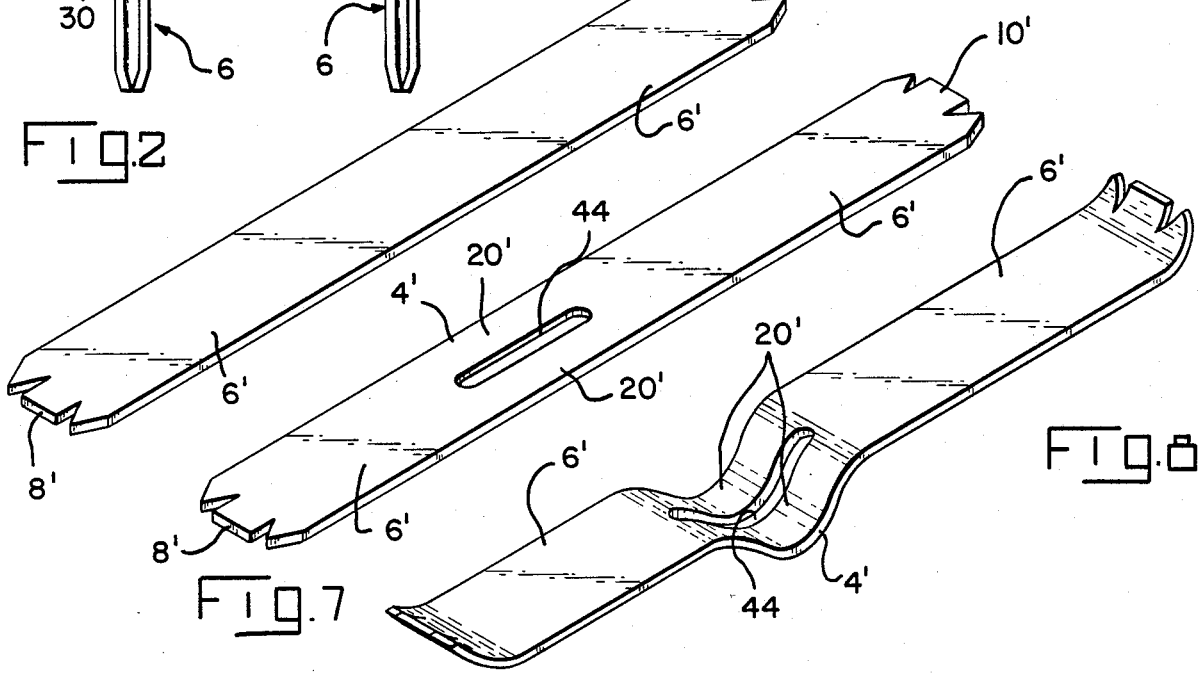

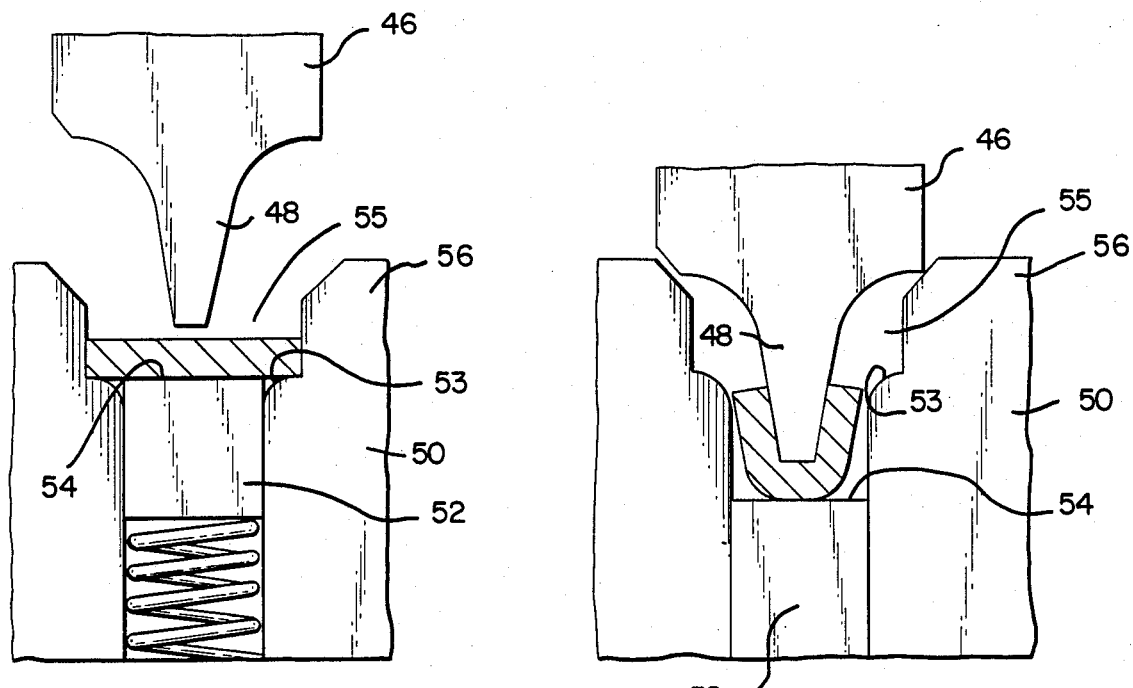
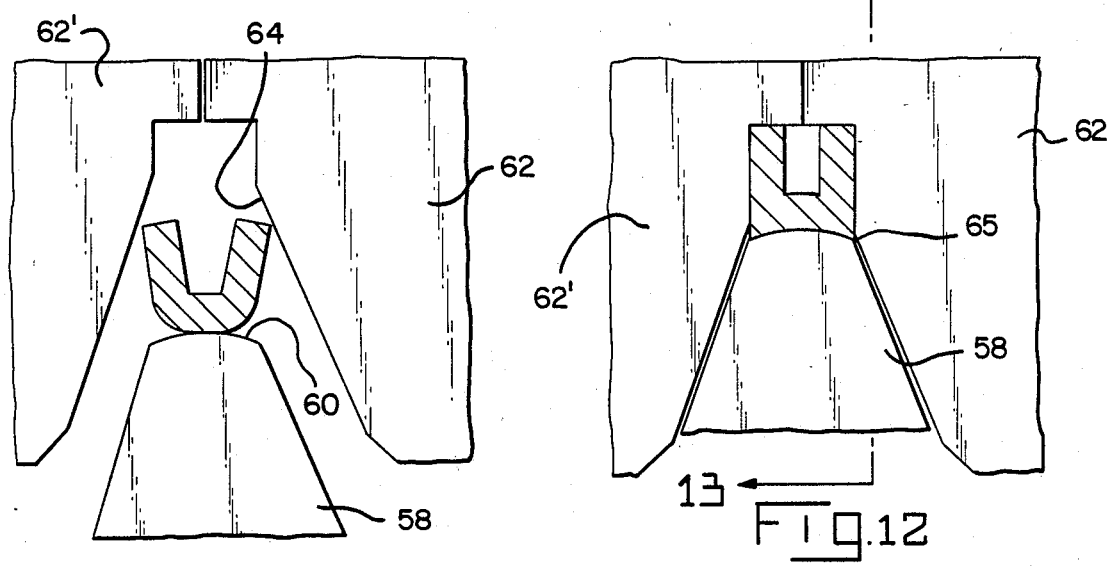
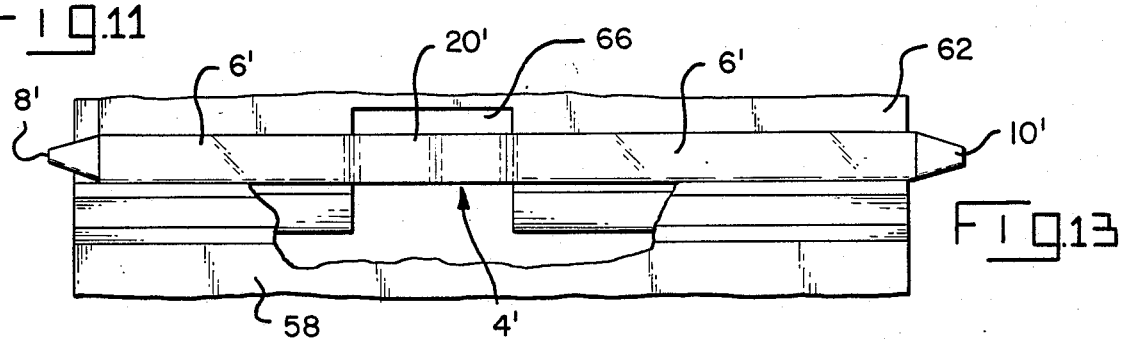

METHOD OF MAKING AN ELECTRICAL TERMINAL

This application is a continuation of application Ser. No. 575,487 filed Jan. 31, 1984, which is a continuation of application Ser. No. 475,811 filed Mar. 16, 1983, which is a divisional of application Ser. No. 232,478 filed Feb. 9, 1981, all of which are abandoned.

FIELD OF THE INVENTION

This invention relates to terminal devices of the type commonly referred to as compliant posts which are intended for insertion into circuit boards and which have deformable compliant portions which bear against the internal surface of the circuit board hole after insertion.

BACKGROUND OF THE INVENTION

It is common practice in the electrical industry to use terminal posts in circuit boards which posts have compliant mounting portions integral therewith. When a terminal post of this type is inserted into a hole in a circuit board, the mounting portion is deformed upon entry into the circuit board hole so that the mounting portion bears against the cylindrical surface of the hole thereby retaining the post in the circuit board. Most terminal posts having these compliant mounting portions are intended for use with circuit boards having plated through-holes, that is, holes having a metallic surface so that the terminal post will be placed in electrical contact with the plating when it is inserted into the hole. No subsequent soldering is required for posts of the compliant type. U.S. Pat. Nos. 4,186,982, 4,206,964 and 4,066,326 show typical terminal posts having compliant mounting portions.

Most of the terminal posts having compliant mounting portions which are presently available are formed from solid bar stock having a square cross-section and are made in standard sizes, usually 0.025" square or 0.045" square. The compliant mounting portions may be formed by shearing a blank and offsetting two portions thereof in a forming die in a manner such that these two portions are displaced towards each other when the post is inserted into a circuit board hole. Alternatively, the posts can be stamped from relatively thick metal stock, as shown in the above identified U.S. Pat. No. 4,206,964. It would be desirable under many circumstances to have terminal posts having compliant mounting portions which are formed of relatively thin sheet metal stock so that an additional terminal device, for example, a terminal socket, might be formed integrally with the terminal post. U.S. Pat. No. 3,420,087 discloses and claims a stamped and formed terminal device having resilient contact portions of relatively thin sheet metal and having an integral terminal post formed also from relatively thin sheet metal. The terminal post portion of the terminal devices shown in this prior art patent is produced by stamping and forming portions of a flat blank into a U-shaped cross-section and during these forming operations the blank is severely coldworked and hardened. The resulting post portion of the terminal is thus relatively stiff and has all of the characteristics of a solid post, while the remaining portion of the terminal has the characteristics of a stamped and formed sheet metal terminal device which may have resilient contact means, such as a contact socket or resilient spring arm thereon.

The present invention is directed to the achievement of a terminal post having a compliant mounting means integral therewith and is formed from relatively thin sheet metal. The present invention is thus directed to the achievement of a compliant mounting portion on a stamped and formed terminal post of the general type disclosed in the above identified U.S. Pat. No. 3,420,087.

The invention is further directed to the achievement of a terminal post having a compliant mounting portion which has elastic characteristics to the extent that a post can be extracted from a hole into which it has been inserted and reinserted at a later time without detrimental effects on the retaining power of the post or the electrical contact with the plating material in the hole. The invention is further directed to the achievement of a compliant post which can be produced for use in circuit board holes having a relatively wide range of diameters. The invention is also directed to the achievement of a terminal post having a compliant mounting portion which can be produced with varying characteristics as regards the force exerted by the compliant portion on the circuit board hole, the insertion and extraction forces and other variables.

Terminal posts in accordance with the invention can be produced by starting with a flat blank of conductive sheet metal, such as brass or beryllium copper, and first punching a slot in the blank at the desired location of the compliant portion of the finished post. A curved portion or arcuate portion, is then formed in the blank in the vicinity of the slot so that the material on each side of the slot is bowed outwardly from the plane of the blank. Thereafter, the stock material extending from the ends of the blank to the slot is formed into a U-shaped cross-section by forming methods which include severe coldworking of these portions of the blank during the U-ing operation. During the U-ing operation, the material on each side of the slot is swung through an angle of 90° and the bowed portions thus become extensions of the sidewalls of the U-shaped portions of the post when it is formed to its final shape. The bowed portions of the blank are not subjected to the severe coldworking imposed on the remainder of the blank during the U-ing operation and these bowed portions thereby serve as resilient or elastic mounting portions which will deform towards each other when the post is inserted into a circuit board hole.

BRIEF DESCRIPTION OF THE DRAWINGS

FIG. 1 is a perspective view of one form of terminal post in accordance with the invention.

FIG. 2 is a part longitudinal section view showing a terminal device extending into a hole in a circuit board, this view showing the mounting portion immediately prior to its entry into the circuit board hole.

FIG. 3 is a view similar to FIG. 2 but showing the post as fully inserted into the circuit board hole.

FIG. 4 is a view taken along the lines 4—4 of FIG. 3, it being assumed in this view that the post has been inserted into a relatively small diameter hole.

FIG. 5 is a view similar to FIG. 4 but showing a relationship of the parts when the post is inserted into a relatively large diameter hole.

FIGS. 6, 7, and 8 are perspective views showing the successive stages of producing the terminal post of FIG. 1 from a flat blank.

FIG. 9 is a fragmentary view illustrating a forming die and punch changes that would be required to initially form the flat blank of FIG. 8 into a U-shaped cross-section, this view showing the positions of the parts after the blank has been positioned in the die and prior to descent of the punch.

FIG. 10 is a view similar to FIG. 9 but showing the positions of the parts after the punch has been lowered and the blank formed into a U-shaped cross-section.

FIG. 11 is a fragmentary view showing tooling for forming the partially completed post into its final shape, this view showing the positions of the parts prior to descent of the upper forming tooling.

FIG. 12 is a view similar to FIG. 11 but showing the positions of the parts after the upper tooling has moved downwardly and the forming operation has been completed.

FIG. 13 is a view taken along the lines 13—13 of FIG. 12.

DETAILED DESCRIPTION OF THE STRUCTURE OF THE TERMINAL

Preferred Embodiment

Figure 14:
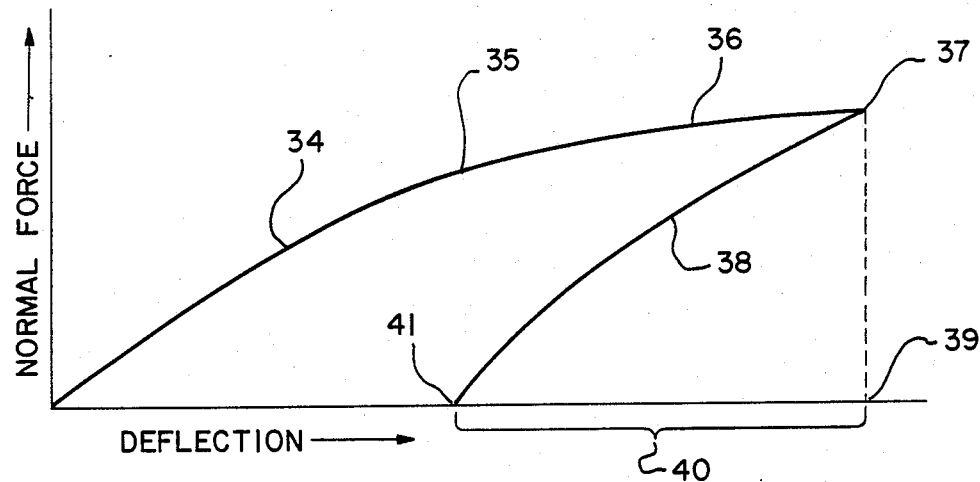
FIG. 14 is a plot of force versus deflection for the compliant portion of a terminal post in accordance with the invention.

Referring first to FIG. 1, a terminal device 2 in accordance with the invention has a compliant mounting portion 4 intermediate the ends thereof, and post portions 6 extending from the compliant mounting portion to the ends 8, 10. It will be understood that if desired, another contact device might be provided on either of the ends 8, 10 such as a cylindrical terminal socket dimensioned to receive a complementary terminal pin or a receptacle intended to receive a tab or the like.

The post portions 6 of the terminal device are of U-shaped or channel-shaped cross-section and are identical to each other. Each post portion has a web 12 and sidewalls 14 which extend from the marginal side portions of the web. The external lower edges 16 formed by the sidewalls and the sides of the web and the upper edges 18 at the upper ends of the sidewalls are relatively sharp and severely coldworked so that the post portions 6 of the terminal can be used for wrap-type or clip type connections. Alternatively, these post portions can serve as contact pins and can be mated with complementary terminal devices. As will be explained below, these post portions are produced in accordance with the teachings of the above identified U.S. Pat. No. 3,420,087 to which reference is hereby made and which is hereby incorporated by reference.

The compliant mounting portion 4 comprises opposed outwardly bowed portions 20 having outwardly facing surfaces 22. The bowed portions merge longitudinally with the sidewalls 14 and the outwardly facing surfaces 22 are generally cylindrical, that is, they are preferably not curved inwardly between the upper and lower edges. As shown in FIG. 2, these bowed portions are generally semielliptical and are symmetrical with respect to the longitudinal axis of the terminal post. These bowed portions 20 are capable of both elastic and plastic deformation when the post is inserted into a circuit board hole and will retain a significant degree of elasticity after they have been inserted. These bowed portions, in other words, are not in the severely coldworked condition of the post portions of the terminal device, as explained above, which will become apparent as this description proceeds.

Referring now to FIGS. 2 and 3, the terminal device 2 can be mounted in a circular hole 30 in a circuit board or the like 24 having an upper surface 26. The hole 30 is provided with plating on its internal surface as shown at 32, and the plated metal in the hole extends to the conductors 33 on the upper surface 26 of the circuit board. The post 2 is mounted in the circuit board by simply inserting the lower end into the hole as shown in FIG. 2 and then pushing the post downwardly to the position of FIG. 3 until the compliant mounting portion 4 is fully contained in the hole. During movement of the mounting portion into the hole, the bowed portions of the mounting portion are flexed towards each other so that their radii curvature, as viewed in FIG. 3, obviously increases slightly. As shown in FIG. 4, the corners defined by the edges of the bowed portions bear against the plating of the hole and the outwardly facing surfaces 22 assume a chordal relationship with the surface of the hole by virtue of the fact that the corners of the bowed portions are against the plating in the hole and the fact that the bowed portions are in flexed condition. These corners are thus pressed into and against the plating, thereby establishing electrical contact. The forces developed by the flexed bowed portion also serve to retain the post in the circuit board hole. As illustrated by FIG. 5, a post of given dimensions can be used with circuit board holes of varying diameters. FIG. 4 illustrates the condition which exists when the post is inserted into a hole at the lower end of the acceptable hole diameter range, while FIG. 5 shows the positions of the parts when the hole has a diameter at the upper end of the acceptable diameter range.

Forming of the Terminal

A terminal post as shown at 2 is produced by forming a blank 42 through the successive stages shown in FIGS. 6–8 and 9–13. The flat blank 42 has ends 8', 10' which are notched as shown to produce the partially closed ends of the finished terminal post and has length which is substantially equal to, or very slightly greater than, the desired length in the finished terminal post. The first step in producing the terminal of FIG. 1 is to punch an elongated slot 44 in the blank midway between the side edges thereof and in the location desired for the mounting portion 4 in the finished terminal post. The width of the slot 44 is substantially equal to the width of the web 12 in the finished terminal device such that there are intermediate portions of the blank adjacent slot 44.

After punching of the slot 44, the blank is formed to produce arcuate cylindrical depressions 20' on the intermediate portions thereof outwardly from their axes on each side of the slot 44. These arcuate portions 20' are preferably produced by bending without substantial stretching or elongation of the material which is deformed so that the overall length of the blank is reduced very slightly during this stage. The flat portions 6' on each end of the slot are not deformed at this stage of the manufacturing process.

Thereafter, the U-shaped post portions 6 are produced by forming up marginal side portions of the flat sections of the blank and during such forming, the arcuate portions 20' will be rotated in opposite directions each through an angle of about 90° so that in the finished terminal device they will be opposed to each other as in FIG. 1, and will be symmetrical with respect to an axis extending transversely of the axis of the terminal post and with respect to the axis of the post portions. The U-ing operation is carried out in accordance with the general teachings of the above identified U.S. Pat. No. 3,420,087 and is illustrated only briefly in FIGS. 9–13 and to the extent necessary for an understanding of the present invention.

The U-ing operation is carried out in two stages, the first stage being illustrated in FIGS. 9 and 10 and the second stage in FIGS. 11–13. In the first stage of the U-ing operation, the blank is placed in a recess 55 in the upper portion 56 of a die 50. A spring loaded anvil 52 is centrally located in the recess 55 and the blank is placed on the upper surface 54 of this anvil. The first stage of the U-ing operation is carried out by a punch 48 on the lower end of shank portion 46. When the punch 48 moves downwardly as shown in FIG. 10, the flat blank is partially formed as the anvil 52 is moved downwardly and the lower surface of the blank moves over the curved lead-in surfaces 53 of the die.

After this first stage of the U-ing operation has been carried out, the partially formed terminal device is placed on the upper surface 60 of a coining anvil 58, this upper surface being concave upwardly as viewed in FIG. 11, for reasons which become apparent. The upper tooling for the second stage of the coining operation comprises two mirror image coining dies 62 and 62' which are capable of moving towards each other from the position shown in FIG. 11 and downwardly towards the coining anvil to the position shown in FIG. 12. The forming surfaces 64 of the dies 62, 62' are dimensioned such that the sidewalls of the partially formed blank are bent inwardly towards each other and the partially formed blank is severely coldworked and coined in the corners indicated at 65, and as fully explained and in U.S. Pat. No. 3,420,087. As a result of this severe working of the blank in this final U-ing stage, the post portions 6 on each side of the resilient mounting portion are extremely stiff and hard and have substantially all of the physical characteristics of a post formed from solid stock material.

The upper tooling 62, 62' is relieved or cut away, as shown at 66, FIG. 13, thereby to provide clearance for the arcuate portions 20' of the blank during the U-ing operations. It is of course necessary to also provide clearance in the tooling when the first stage of the U-ing operation, FIGS. 9 and 10, is carried out.

FIG. 14 is a plot or graph which illustrates the behavior of the compliant portion of the post when the post is inserted into a circuit board hole. In this Figure, the normal force, the force exerted by the bowed portions of the post against the circuit board hole, is shown on the ordinate and the deflection of the bowed portion is represented on the abscissa. No units are shown on this plot, therefore it is applicable to either one of the bowed portions or both of the bowed portions of a terminal. As the bowed portions move into the circuit board hole, each bowed portion is elastically deformed as illustrated by the portion 34 of the curve and the normal force exerted increases substantially linearly. At some point shown at 35, the elastic limit is exceeded and the bowed portions begin to deform plastically during the remaining portion of the insertion step, as shown at 36. Deflection increases further during this period. After insertion has been completed, the conditions shown at 37 will exist and the bowed portions will be exerting a predetermined normal force on the circuit board hole and they will be deformed by an amount indicated at 39. If the post should be extracted from the hole, the bowed portions will partially return, as indicated by the line 38, to their normal or original positions, but they will remain plastically deformed to some extent, as indicated at 41. Thereafter, the posts can be reinserted into the same hole in the circuit board and during reinsertion, the bowed portions will be flexed under conditions represented by the line 38 of the curve. The range of deflection is of course indicated at 40 and is the difference between the amount of deflection shown at 39 and the amount shown at 41. It is thus apparent that while the bowed portions may be plastically deflected, as shown at 36, during insertion, the springback characteristics of the metal will nonetheless permit withdrawal and reinsertion of the post into a hole having the same diameter as the hole into which the post was originally inserted.

Depending upon the actual diameter of the circuit board hole, the bowed portions may be deformed initially entirely within the elastic range 34 and may never reach the yield point 35. Alternatively, the bowed portions may be deflected by a greater amount than shown at 37, if the post is being inserted into a small diameter hole. The fact that the posts continue to behave in a resilient manner after insertion permits withdrawal of a post and insertion under circumstances where such reinsertion is desirable.

Terminal devices in accordance with the invention may be used under a wide variety of circumstances. As mentioned above, the fact that the terminal post portions 6 and the compliant mounting portion 4 are formed from thin sheet stock metal permits the formation of altogether different types of terminal devices integral with either end of the terminal shown in FIG. 1. For example, a terminal post and a compliant portion may have integral therewith a formed tubular socket or other receptacle dimensioned to receive a tab or the like. Under many circumstances, the invention will be used substantially in the form shown in FIG. 1 and wire-wrap type connections can be made to one of the post portions 2 after the terminals are mounted in a circuit board. A suitable multi-contact connector can be mated with the other ends 6 of the terminals on the opposite side of the circuit board from which the point-to-point wire-wrap connections are made.

The invention can be practiced by producing posts of varying sizes, one a standard size post intended for insertion into circular circuit board holes being of substantially square cross-section having a dimension of 0.025" on each side. The channel shaped cross-section of the post shown approximates this square cross-section. Posts of this size can be produced from sheet stock metal having thickness of about 0.008". The preferred metals are brass, beryllium copper, or a suitable phosphor bronze.

The standard 0.025" square post is commonly inserted into a circular circuit board hole having a nominal diameter of about 0.042", although the hole diameter will vary from about 0.036" to approximately 0.048" because of tolerance variations. Terminal posts in accordance with the invention can therefore be produced with a maximum diagonal dimension by the opposite edges of the bowed portions 20 of 0.052" for circuit board holes in the range of about 0.036" to 0.048".

A distinct advantage of the invention is that the characteristics of the post are determined by the bowed portions 20 and the insertion force required to push the posts into a circuit board hole can therefore be varied by varying the dimensions of these bowed portions. Similarly, a post of given dimensions can be adapted to varying hole sizes by simply changing the dimensions of the post portions. For example, the length of the opening 44 can be increased, if desired, thereby to increase the distance between the bowed portions 20 and adapt the post to a larger diameter hole.

The force exerted on the sidewalls of the circuit board hole by the compliant portion 4 of the post can also be varied somewhat by changing the dimensions of the bowed portions 20, although, as is shown by FIG. 14, the normal force exerted by each bowed portion rises only slowly within increasing deflection after the yield point of 35 is exceeded. It has been found in testing that 0.025" square posts in accordance with the invention, will require an insertion force in the range of about 3 to 4.5 pounds, if the circuit board hole has a diameter of about 0.038". The extraction force required to remove the post from the hole is slightly less, in the range of two to about 3.25 pounds. As previously mentioned, terminal posts can be extracted and reinserted into the same hole repeatedly. Tests have shown that after ten cycles of extraction and reinsertion, acceptable normal forces are still exerted by the compliant portion against the hole.

Figure 15:
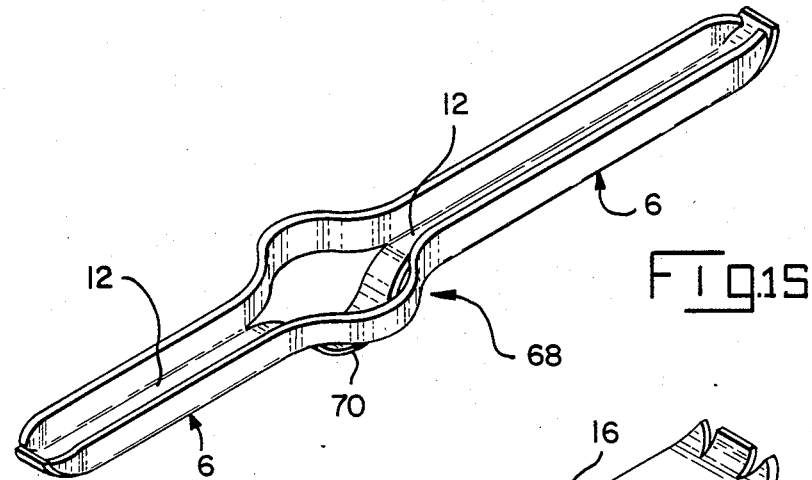
FIG. 15 is a perspective view of an alternative embodiment.
Figure 16:
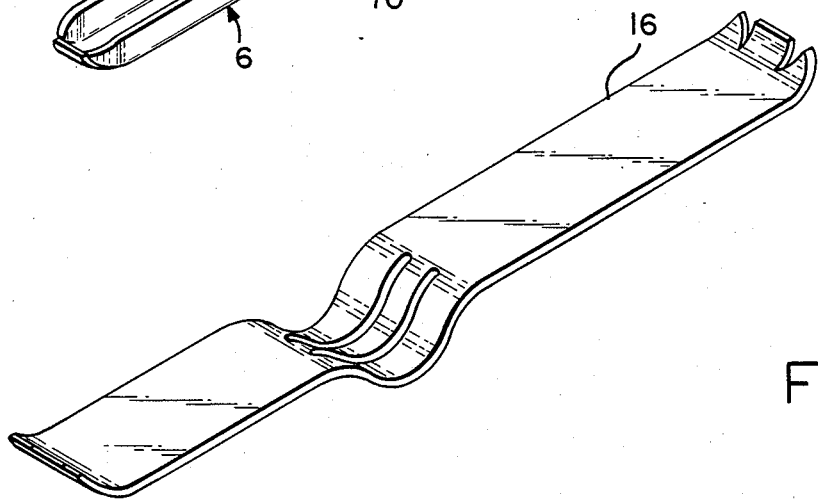
FIG. 16 is a view of a partially formed blank which is used to produce the terminal post of FIG. 15.

FIG. 15 shows an alternative embodiment of the invention 68 having a third bowed portion 70 which merges with the web 12 of the post portions 6. This third bowed portion can be formed by initially forming two spaced-apart slots in the blank 16 creating intermediate portions of the blank adjacent the two slots including a central intermediate portion between them, and then forming the blank as shown. The third bowed portion will further increase the bearing surface area of the compliant portion and will, therefore, increase the insertion and extraction forces.

We claim:

1. A method of manufacturing an integral electrical terminal post for electrical connection in a plated through-hole in a printed circuit board, said post comprising two post portions on ends thereof suitable for wire wrapping and a compliant mounting portion therebetween for electrical and mechanically gripping engagement with said plated through-hole, comprising the steps of:

stamping an elongated flat blank from sheet metal stock having a length which is slightly greater than the combined lengths of said post portions and said compliant mounting portion;

punching at least one axially extending slot in said blank between end portions thereof and remote from side edges thereof, in the desired location for said compliant mounting portion to create at least two intermediate portions in said blank extending adjacent said at least one slot and between said end portions;

forming bowed portions for said compliant mounting portion by forming arcuate depressions in and outwardly from the axes of said at least two intermediate portions;

forming said post portions by forming the remaining flat portions of said blank into a U-shaped configuration by bending up axially extending portions of said blank adjacent to the side edges thereof to form opposing sidewalls joined by a web section therebetween in a manner whereby said bowed portions are substantially unengaged by U-shaping die surfaces, and thereby rotating outer ones of said bowed portions through an angle of substantially 90° whereby said outer ones of said bowed portions are placed in opposing relationship and extend at their ends integrally from corresponding said sidewalls of said post portions; and severely coldworking said post portions of said blank along the junctures of said opposing sidewalls and said web section in a manner whereby said bowed portions are substantially unengaged by coldworking die surfaces, whereby said post portions are stiffened and hardened and said bowed portions remain unhardened and flexible.

2. The method set forth in claim 1 wherein said arcuately bowed portions on each side of said slot are formed by bending said portions of said blank with accompanying shortening of said blank.

3. The method set forth in claim 1 wherein said at least one slot comprises two spaced slots and said at least two intermediate portions comprise three intermediate portions from which are formed three bowed portions, said three bowed portions including said two outer ones of said bowed portions and a center one of said bowed portions which remains unrotated and extends at its ends integrally from corresponding said web sections of said post portions.

* * * * *